(12) United States Patent
Radke

(10) Patent No.: US 7,990,763 B2
(45) Date of Patent: Aug. 2, 2011

(54) MEMORY WITH WEIGHTED MULTI-PAGE READ

(75) Inventor: William Henry Radke, San Francisco, CA (US)

(73) Assignee: Micron Technology, Inc., Boise, ID (US)

( * ) Notice: Subject to any disclaimer, the term of this patent is extended or adjusted under 35 U.S.C. 154(b) by 196 days.

(21) Appl. No.: 12/267,308

(22) Filed: Nov. 7, 2008

(65) Prior Publication Data

US 2009/0067249 A1  Mar. 12, 2009

Related U.S. Application Data

(62) Division of application No. 11/276,477, filed on Mar. 1, 2006, now Pat. No. 7,453,723.

(51) Int. Cl.
*G11C 16/04* (2006.01)

(52) U.S. Cl. .................... 365/185.02; 365/201

(58) Field of Classification Search .................. 714/721; 365/185.02, 185.09, 185.12, 185.17, 201
See application file for complete search history.

(56) References Cited

U.S. PATENT DOCUMENTS

| | | |
|---|---|---|
| 2,717,315 A | 9/1955 | Nemet et al. |
| 5,077,737 A | 12/1991 | Leger et al. |
| 5,621,682 A | 4/1997 | Tanzawa et al. |
| 5,646,835 A | 7/1997 | Katcha |
| 5,754,567 A | 5/1998 | Norman |
| 5,787,484 A | 7/1998 | Norman |
| 5,815,458 A | 9/1998 | Chevallier |
| 5,854,800 A | 12/1998 | Thomann et al. |
| 5,864,569 A | 1/1999 | Roohparvar |
| 5,867,429 A * | 2/1999 | Chen et al. ............... 365/185.33 |
| 5,910,921 A | 6/1999 | Beffa et al. |
| 5,923,682 A | 7/1999 | Seyyedy |
| 5,925,138 A | 7/1999 | Klein |
| 5,935,258 A | 8/1999 | Klein |
| 6,034,891 A | 3/2000 | Norman |
| 6,076,182 A | 6/2000 | Jeddeloh |
| 6,112,314 A | 8/2000 | Norman et al. |
| 6,141,247 A | 10/2000 | Roohparvar et al. |
| 6,178,537 B1 | 1/2001 | Roohparvar |
| 6,279,072 B1 | 8/2001 | Williams et al. |
| 6,331,948 B2 | 12/2001 | Kasai et al. |
| 6,381,672 B1 | 4/2002 | Strongin et al. |
| 6,542,407 B1 | 4/2003 | Chen et al. |
| 6,600,676 B2 | 7/2003 | Shibata et al. |
| 6,657,899 B2 | 12/2003 | Roohparvar |
| 6,674,836 B2 | 1/2004 | Harada et al. |
| 6,728,825 B1 | 4/2004 | Norman |
| 6,734,865 B1 | 5/2004 | Peterson et al. |
| 6,741,253 B2 | 5/2004 | Radke et al. |
| 6,775,168 B1 | 8/2004 | Park et al. |
| 6,784,889 B1 | 8/2004 | Radke |

(Continued)

OTHER PUBLICATIONS

"Micron ECC Module for NAND Flash via Xilinx Spartan-3 FPGA", *Micron Technical Note 2906*, (2005), 21 pgs.

(Continued)

*Primary Examiner* — VanThu Nguyen
(74) *Attorney, Agent, or Firm* — Schwegman, Lundberg & Woessner, P.A.

(57) ABSTRACT

A memory device provides increased output data to help evaluate data errors arising from bit line coupling and floating gate coupling during a read operation. Multiple rows, or pages, of data are read to allow an internal or external decoder to evaluate memory cell data.

17 Claims, 4 Drawing Sheets

U.S. PATENT DOCUMENTS

| | | |
|---|---|---|
| 6,838,331 B2 | 1/2005 | Klein |
| 6,870,749 B1 | 3/2005 | Park et al. |
| 6,870,774 B2 | 3/2005 | Roohparvar et al. |
| 6,883,044 B1 | 4/2005 | Roohparvar |
| 6,906,691 B2 | 6/2005 | Park et al. |
| 6,975,698 B2 | 12/2005 | Katcha et al. |
| 6,982,900 B2 | 1/2006 | Hirabayashi |
| 6,987,684 B1 | 1/2006 | Branth et al. |
| 6,999,376 B2 | 2/2006 | Roohparvar |
| 7,196,928 B2 | 3/2007 | Chen |
| 7,369,434 B2 | 5/2008 | Radke |
| 7,372,730 B2 * | 5/2008 | Chen .................. 365/185.02 |
| 7,397,697 B2 | 7/2008 | So et al. |
| 7,443,726 B2 * | 10/2008 | Guterman ............ 365/185.05 |
| 7,453,723 B2 | 11/2008 | Radke |
| 7,738,292 B2 | 6/2010 | Radke |
| 2001/0023475 A1 | 9/2001 | Palowski |
| 2002/0070941 A1 | 6/2002 | Peterson et al. |
| 2003/0041210 A1 | 2/2003 | Keays |
| 2003/0067472 A1 | 4/2003 | Radke et al. |
| 2003/0115538 A1 | 6/2003 | Derner et al. |
| 2004/0183808 A1 | 9/2004 | Radke et al. |
| 2005/0172207 A1 | 8/2005 | Radke et al. |
| 2005/0268203 A1 | 12/2005 | Keays et al. |
| 2006/0248434 A1 | 11/2006 | Radke et al. |
| 2007/0206434 A1 | 9/2007 | Radke |
| 2008/0037320 A1 | 2/2008 | Radke |
| 2008/0215930 A1 | 9/2008 | Radke |
| 2010/0238726 A1 | 9/2010 | Radke |

OTHER PUBLICATIONS

"NAND Flash Memory MT29F4G08AAA, MT29F8G08BAA, MT29F8G08SDAA, MT29F16G08FAA", (Aug. 2006), 81 pgs.

* cited by examiner

MEMORY WITH WEIGHTED MULTI-PAGE READ

RELATED APPLICATION

This application is a divisional of U.S. application Ser. No. 11/276,477, filed on Mar. 1, 2006, now U.S. Pat. No. 7,453,723 which is incorporated herein its entirety.

FIELD OF THE INVENTION

The present invention relates to non-volatile memory devices and, more particularly, to flash memory devices.

BACKGROUND

Flash memory is non-volatile, which means that it stores information on a semiconductor in a way that does not need power to maintain the information in the chip. Flash memory stores information in an array of transistors called "cells," each of which traditionally stores one or more bits of information. Current flash memory devices are made in two forms: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current can be sensed and translated into 1's and 0's, reproducing the stored data.

Memory cells of memory devices are typically arranged in an array with rows and columns. Generally, the rows are coupled via a word line conductor and the columns are coupled via a bit line conductor. During data read and write functions, voltage coupling between bit lines can influence proper memory operation. Further, close physical proximity of memory cells can result in floating gate to floating gate coupling. Again, coupling can influence proper memory operation and data accuracy.

For reasons stated below which will become apparent to those skilled in the art upon reading and understanding the present specification, there is a need for methods and devices to read non-volatile memory devices.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice, as is well known in the art. The figures are provided to help facilitate an understanding of the detailed description, are not intended to be accurate in scale, and have been simplified. The term conductor as used herein is intended to include conductors and semi-conductors, including but not limited to metals, metal alloy, doped silicon and polysilicon.

The following detailed description is, therefore, not to be taken in a limiting sense, and the scope of the present invention is defined only by the appended claims, along with the full scope of equivalents to which such claims are entitled.

Figure 1:
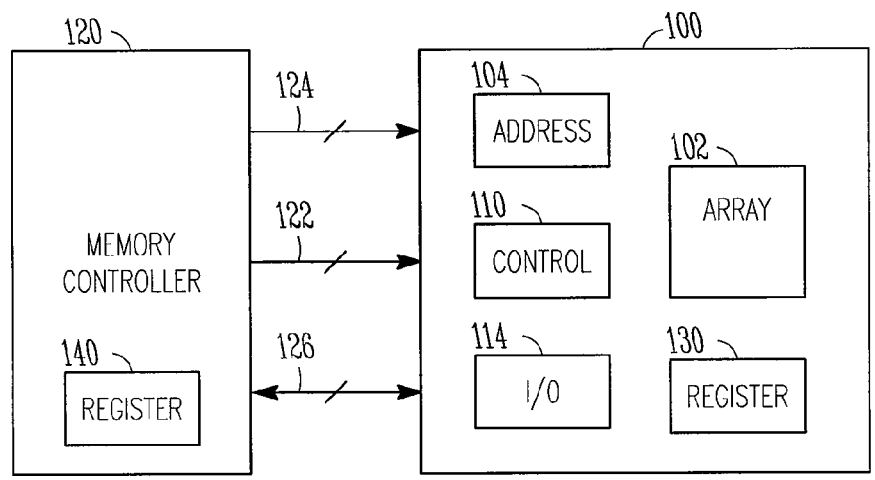
FIG. 1 is a block diagram of a memory device according to embodiments of the present invention.

FIG. 1 is a simplified block diagram of an integrated circuit memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as Flash memory cells because blocks of memory cells are typically erased concurrently, in a flash operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data can be written to or read from the memory cells across data, DQ, lines 126.

In addition to general memory functions, control circuit 110 performs a read operation on the memory cells. As explained below, the read operation can include accessing multiple rows or pages of data to allow for a more informed reading of data.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Figure 2:
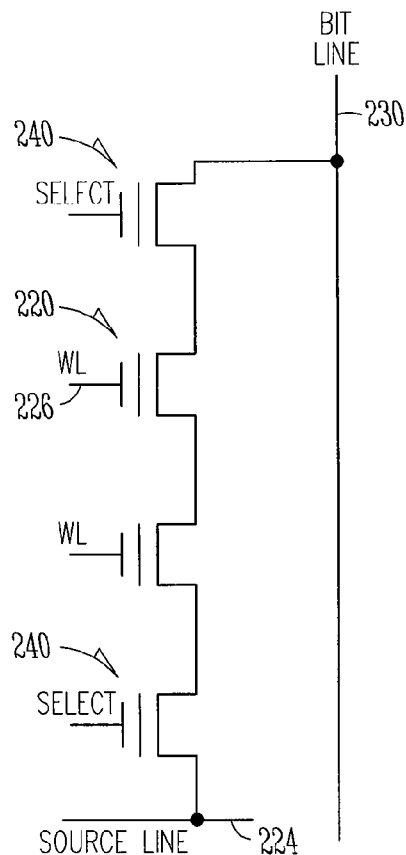
FIG. 2 illustrates a simplified portion of a NAND flash memory array of FIG. 1.

FIG. 2 illustrates a simplified portion of a NAND flash memory array of one embodiment of FIG. 1. NAND Flash uses tunnel injection for writing and tunnel release for erasing. The NAND memory includes floating gate memory cells 220 coupled to source line 224, word lines 226 and a bit line 230. The cells are coupled in series between the bit line and source line. One or more bit line select transistors 240 are used to selectively isolate the cells from the bit and source lines.

In a read operation, a word line of a target (selected) memory cell can be maintained at a low voltage level. All unselected cell word lines are coupled to a voltage sufficiently high to activate the unselected cells regardless of their floating gate charge. If the selected cell has an uncharged floating gate, it is activated. The bit line and source line are then coupled through the series of memory cells. If the selected cell has a charged floating gate, it will not activate. The bit line and source lines, therefore, are not coupled through the series of memory cells.

Because of the close proximity of the memory cells, bit line coupling can be a problem during reading/sensing operations. That is, the length and close spacing of adjacent bit lines results in voltage noise on bit lines. In addition to bit line coupling, floating gate to floating gate coupling of adjacent rows, or pages, of memory cells can influence data storage and reading. Prior art light imager sensors often use data levels from neighboring pixels to interpolate a pixel level for a specific pixel. That is, one pixel is typically not independent of a neighboring pixel in that light does not abruptly change from pixel to pixel, but has a change gradient. Embodiments of the present invention recognize that although memory cell data can abruptly change from cell to cell, the close physical proximity of cells can be used advantageously to evaluate data which may have been altered by neighboring cells.

During a read operation, the memory device accesses an identified target cell, row, or page, of the memory array. In addition to the identified cell or row, the memory accesses one or more physically adjacent cells or rows of the array. The multiple rows of data are used to evaluate the data of the identified cells and possible data influences from the cells of adjacent row(s). It will be appreciated that the adjacent row(s) are based on physical location and not necessarily address proximity. For example, adjacent rows of a NAND memory array are typically assigned to different addressable pages.

The multiple pages of data are weighted and used to evaluate a page of data. The weighting function can be performed using a fixed weight value or custom weight functions. In one embodiment, the memory device is tested and custom (device specific) weighting data, or matrix, is calculated based upon actual memory cell influences. The weighting data can be stored in the memory device, such as in weighting register 130 of FIG. 1, or in an external location such as register 140 with processor 120.

In one embodiment, when reading a row of data, the weighting data can be applied to the accessed data by the memory device prior to outputting the data. In another embodiment, the weighting data is read from the memory to be applied by the external processor.

Figure 3:
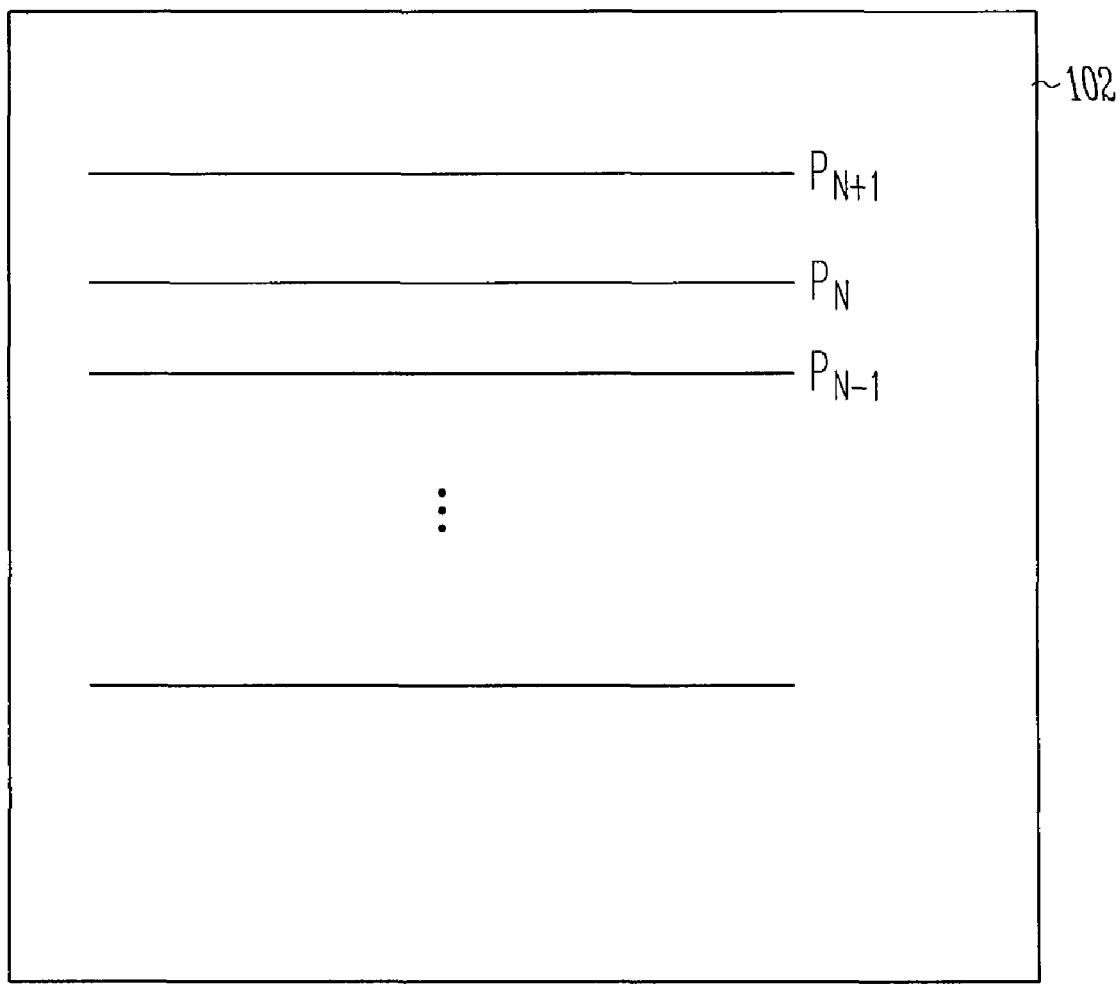
FIG. 3 illustrates a portion of an array of FIG. 1.
Figure 4:
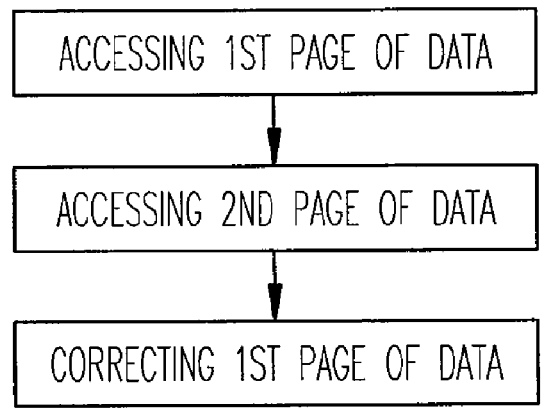
FIG. 4 is a flow chart according to an embodiment.
Figure 5:
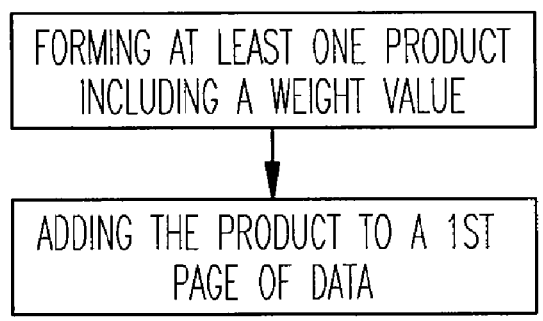
FIG. 5 is a flow chart according to an embodiment.
Figure 6:
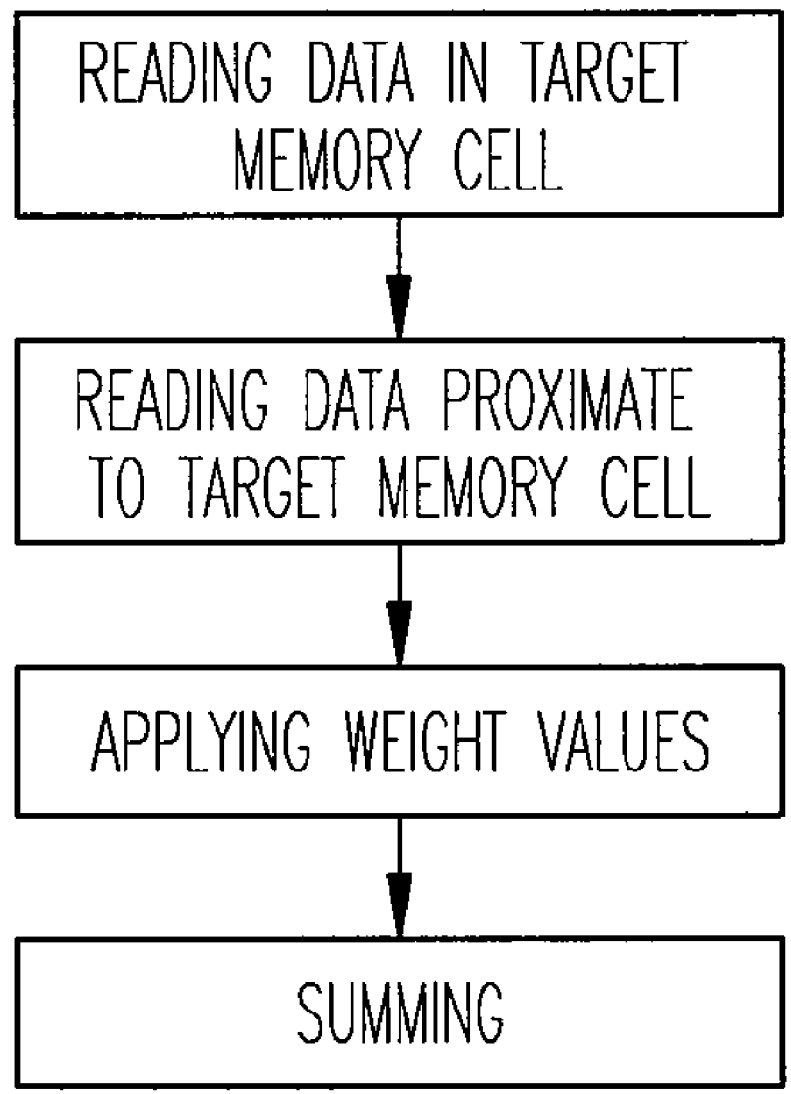
FIG. 6 is a flow chart according to an embodiment.

An example read operation is described with reference to the array 102 of FIG. 3. The array illustrated is one embodiment of the memory of FIG. 1 and is simplified to illustrate array data pages of embodiments of the invention and not actual physical construction of the array. In response to a read request for page $P_N$, the memory accesses pages $P_N$, $P_{N+1}$ and $P_{N-1}$ where $P_{N+1}$ and $P_{N-1}$ are physically adjacent to page $P_N$. If $P_N$ is located at an array edge with only one adjacent page, that page $P_{N-1}$ is accessed.

Using the data from two or more pages the data value for a specified cell can be evaluated. The following examples illustrate some of the possible way to evaluate the data.

EXAMPLE I

This example applies weight values to the adjacent pages to account for page to page coupling. The weighted value is calculated as:

$$\text{Weighted } P_N(i) = P_N(i) + W_{-1} P_{N-1}(i) + W_{+1} P_{N+1}(i),$$

where $P_N(i)$ is the $i^{th}$ cell in the $P_N$ page, $W_{-1}$ is the weight value applied to cells of page $P_{N-1}$ and $W_{+1}$ is the weight value applied to cells of page $P_{N+1}$.

EXAMPLE II

This example applies weight values to the adjacent pages to account for page to page coupling and coupling within the page. The weighted value is calculated as:

$$\text{Weighted } P_N(i) = P_N(i) + W_{-1} P_{N-1}(i) + W_{+1} P_{N+1}(i) + W_A P_N(i-1) + W_B P_N(i+1),$$

where $W_A$ is the weight value applied an adjacent cell $P_N(i-1)$ on page $P_N$ and $W_B$ is the weight value applied another adjacent cell $P_N(i+1)$.

EXAMPLE III

This example applies weight values to four adjacent pages to account for page to page coupling and coupling within the page. The weighted value is calculated as:

$$\text{Weighted } P_N(i) = P_N(i) + W_{-2} P_{N-2}(i) + W_{-1} P_{N-1}(i) + W_{+2} P_{N+2}(i) + W_{+1} P_{N+1}(i) + W_A P_N(i-1) + W_B P_N(i+1).$$

EXAMPLE IV

This example applies weight values to two adjacent pages to account for page to page coupling from multiple cells. The weighted value is calculated as:

$$\text{Weighted } P_N(i) = P_N(i) + [W_{-1} P_{N-1}(i) + W_{A-1} P_{N-1}(i-1) + W_{B+1} P_{N-1}(i+1)] + [W_{+1} P_{N+1}(i) + W_{A-1} P_{N+1}(i-1) + W_{B+1} P_{N+1}(i+1)],$$

where $W_{A-1}$ is a weight value applied to cells $P_{N-1}(i-1)$ and $P_{N+1}(i-1)$ of adjacent pages and $W_{B+1}$ is a weight value applied to cells $P_{N-1}(i+1)$ and $P_{N+1}(i+1)$.

The above examples illustrate different weighting equations that can be applied to evaluate data in a non-volatile memory device. The evaluation can include determining an influence factor of a second array page upon a first array page. It will be appreciated by those skilled in the art with the benefit of the present description that additional equations can be formulated. The invention is therefore not limited to these specific examples.

A non-volatile memory device has been described that provides increased output data to help evaluate data errors from bit line coupling and floating gate coupling. Multiple rows, or pages, of data are read to allow an internal or external decoder to evaluate memory cell data.

Although embodiments have been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The invention claimed is:
1. A non-volatile memory device comprising:
   an array of non-volatile memory cells arranged in addressable rows and columns;
   control circuitry to access the array; and
   output circuitry configured to:
      output data from a first one of the addressable rows in response to a read operation;

output data from a first array row located physically adjacent to the first one of the addressable rows in response to the read operation;

form a product using data output from the first adjacent array row and a weight value; and add the data output from the first one of the addressable rows and the product to form corrected output data from the first one of the addressable rows.

2. The non-volatile memory of claim 1, further comprising a register to store weighting values.

3. The non-volatile memory of claim 2, wherein the data from an array row located physically adjacent to the first addressable row is multiplied by the weighting values prior to outputting.

4. The non-volatile memory of claim 3, wherein the output circuitry is to correct a first data point by forming at least one product including a weight value applied to a second data point.

5. The non-volatile memory of claim 1, wherein the output circuitry is to correct a first data point by forming at least one product including a weight value applied to a second data point.

6. The non-volatile memory of claim 5, wherein the array of non-volatile memory cells is to store the weight value.

7. A flash memory device comprising:
an array of floating gate transistor memory cells arranged in addressable rows and columns;
a control line to access the array;
a register to store weighting values; and
output circuitry configured to:
output data from a first addressable row in response to a read operation;
output data from first and second array rows located physically adjacent to the first addressable row in response to the read operation;
form a first product using the data output from the first adjacent array and a first one of the weight values;
form a second product using the data output from the second adjacent array and a second one of the weight values; and
add the data output from the first addressable row, the first product, and the second product to correct the data output from the first addressable row.

8. The flash memory of claim 7, wherein the data from an array row located physically adjacent to the first addressable row is multiplied by the weighting values prior to the output circuitry outputting a value.

9. The flash memory of claim 7, wherein the array of floating gate transistor memory cells is a NAND array.

10. A method of reading data from a memory device comprising:
reading data stored in a first memory cell to provide read data; and
adjusting the read data based upon a data state of neighboring memory cells in the memory device, wherein the adjusting includes
forming a product using the data state of an adjacent memory cell and a weight value; and
adding the product to the read data to form adjusted read data.

11. The method of claim 10, wherein the neighboring memory cells are located in an array page adjacent to an array page containing the first memory cell.

12. The method of claim 11, wherein adjusting includes forming at least one product including a weight value applied to data stored in the first memory cell.

13. The method of claim 12, wherein reading comprises reading from a NAND memory cell.

14. The method of claim 10, wherein the neighboring memory cells are located in a common array page containing the first memory cell.

15. The method of claim 14, wherein adjusting includes forming at least one product including a weight value applied to data stored in the first memory cell.

16. The method of claim 10, wherein reading comprises reading from a NAND memory cell.

17. The non-volatile memory device of claim 1, wherein the output circuitry is configured to:
output data from a second array row located physically adjacent to the first addressable row in response to the read operation;
form a second product using data from the second adjacent row and a same or a different weight value; and
correct the output data from the first addressable row by adding the output data, the first product, and the second product.

* * * * *